United States Patent [19]

Calvet et al.

[11] Patent Number: 4,833,727

[45] Date of Patent: May 23, 1989

[54] REMOTE-CONTROLLED RECEIVER ARRANGEMENT USING A MODULATED CARRIER

[75] Inventors: Jean-Claude Calvet, Rambouillet; Jacques Mauge, Dampierre, both of France

[73] Assignee: U.S. Philips Corporation, New York, N.Y.

[21] Appl. No.: 810,435

[22] Filed: Dec. 17, 1985

[30] Foreign Application Priority Data

Dec. 28, 1984 [FR] France ............................ 84 19980

[51] Int. Cl.⁴ .......................................... H04B 11/16
[52] U.S. Cl. .................................... 455/151; 455/186; 358/194.1
[58] Field of Search ............... 358/194.1, 193.1, 195.1; 455/151, 186, 352, 353, 161, 155, 154, 255–260, 179, 182, 192, 196, 199, 208, 603; 340/696

[56] References Cited

U.S. PATENT DOCUMENTS

| | | |
|---|---|---|
| 4,231,031 | 8/1980 | Crowther et al. ................. 455/151 |
| 4,495,654 | 1/1985 | Deiss .............................. 358/194.1 |
| 4,510,623 | 9/1985 | Bonneau et al. .................... 455/151 |
| 4,517,564 | 5/1985 | Morishita et al. ................ 358/194.1 |
| 4,566,034 | 1/1986 | Harger et al. ....................... 455/151 |
| 4,567,512 | 1/1986 | Abraham ............................. 455/151 |
| 4,626,847 | 12/1986 | Zato ................................ 358/194.1 |
| 4,626,848 | 2/1986 | Ehlers ............................. 358/194.1 |
| 4,649,428 | 3/1987 | Jones et al. ...................... 358/194.1 |
| 4,688,261 | 8/1987 | Killoway et al. .................... 455/151 |

*Primary Examiner*—Robert L. Griffin
*Assistant Examiner*—Curtis Kuntz
*Attorney, Agent, or Firm*—Marianne R. Rich

[57] ABSTRACT

A remote controlled radio frequency receiver. A modulated carrier having a frequency F1 containing remote control data is received in a radio frequency receiver having a local oscillator and demodulator. The data contained in the received carrier is produced as digital data. A microprocessor executes commands represented by the digital data. The radio receiver frequency receiver is tuned by a frequency synthesizer which is incremented by a microprocessor to tune a frequency band containing the modulated carrier. A non-volatile memory is provided for storing the value of a carrier frequency, and the value of an access signal in the event a carrier transmitter fails to produce the modulated carrier containing the needed remote control data.

9 Claims, 1 Drawing Sheet

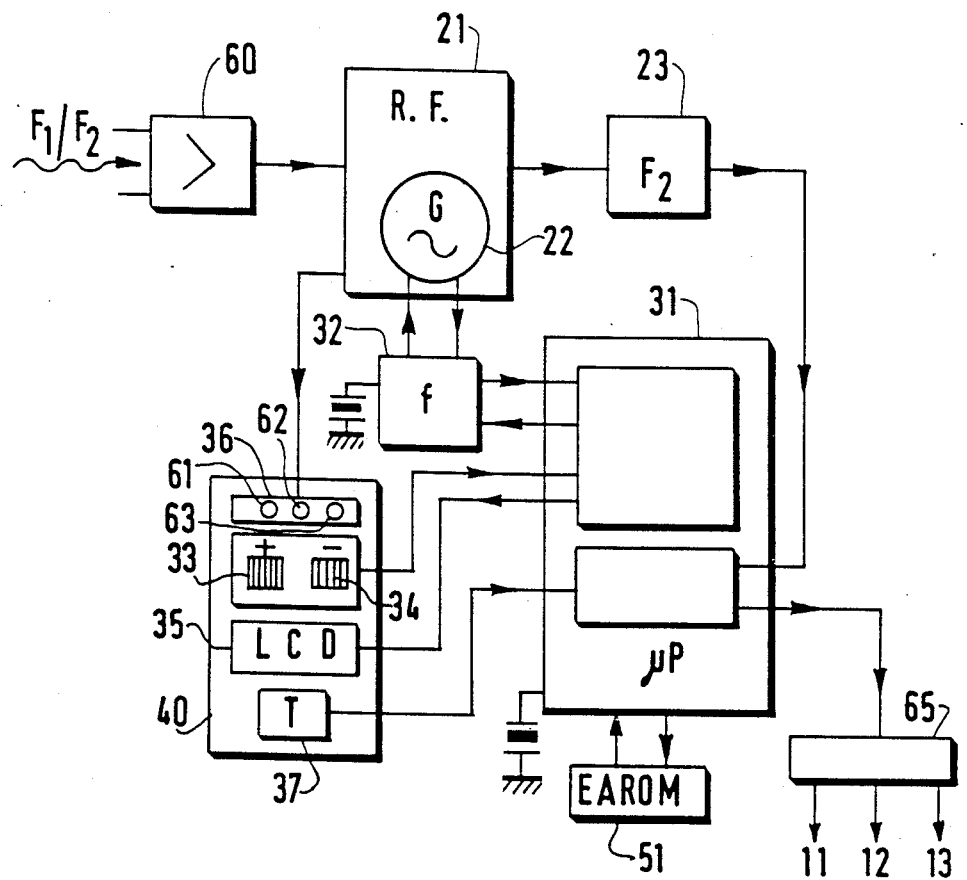

REMOTE-CONTROLLED RECEIVER ARRANGEMENT USING A MODULATED CARRIER

The invention relates to a remote-controlled receiver arrangement using a modulated carrier having a frequency $F_1$, containing remote control data receiver is provided with a local oscillator and a demodulator which supplies the remote control commands in the form of digital data at its output.

The invention can be used to special advantage in the field of remote-controlled domestic and industrial installations, notably in the remote control of circuit interruptors.

A remote-controlled receiver arrangement is referred to in the opening paragraph is known from French patent specification no. 2,375,674. This arrangement is constituted by a main transceiver transmitting the remote control commands to a plurality of subtransceivers which in their turn transmits the data ackowledging the execution of the received commands to the main transceiver. This arrangement has the drawback that it requires a large number of both transmitter and receiver stations which results in a heavy and costly arrangement.

The invention has for its object to eliminate this drawback by providing an arrangement which requires only one main transmitter and only one sub-receiver.

SUMMARY OF THE INVENTION

According to the invention, a remote-controlled receiver arrangement using a modulated carrier having a frequency $F_1$, containing remote control data and comprising a receiver provided with a local oscillator and a demodulator which supplies the remote control commands in the form of digital data at its output is characterized in that it also comprises on the one hand a microprocessor, inter alia, for managing the remote control commands from digital data supplied by the demodulator and on the other hand means for tuning and locking the local oscillator frequency on the carrier frequency $F_1$.

The microprocessor thus permits of gathering, in a reduced volume and in an inexpensive manner, all the functions that are to be realised by the receiver arrangement according to the invention.

In a special embodiment of the invention the tuning and locking means are constituted by a frequency synthesizer in cooperation with a frequency-incrementing arrangement incorporated in the microprocessor and controlled to tune through the frequency band.

In order to counteract poor operation, the microprocessor is connected to a non-volatile memory in which the carrier frequency value $F_1$ and the values of the access signal are written, permitting independent functioning of the receiver arrangement in the case of default of the carrier transmitter. At the instant when the operation is restored this frequency is applied to the frequency synthesizer which tunes the local oscillator to the carrier frequency $F_1$. In the same connection, two safety measures are envisaged. Firstly, the non-volatile memory also preserves the initial values of the access signals such as they have been pre-adjusted upon installation of the receiver arrangement, which always provides the possibility of returning to these values, even when they have been modified several times. On the other hand the non-volatile memory permanently preserves the last remote control commands. When the signals are applied to the remote-controlled circuit interruptors, the non-volatile memory thus preserves the open or closed state of the circuit interruptors. After a cut-off or any other incident this arrangement makes it possible for the said circuit interruptors to return to the initial position.

In an economic embodiment, the means for tuning through the frequency band form part of a portable control box which permits of using one box for operating several remote-controlled receiver arrangements according to the invention, situated in different places. The control box comprises a display indicating the value of the tuning frequency. Thus, when the remote-controlled receiver arrangement is installed it is easy to tune the local oscillator to the carrier frequency $F_1$ for which it is sufficient to operate the means for moving through the frequency band until the previously known value of the frequency $F_1$ appears on the display. To ensure that the tuning thus realized is satisfactory, the control box comprises a field level indicator with which the strength of the carrier can be checked.

The invention will now be described in greater detail by way of example with reference to the accompanying FIGURE.

DESCRIPTION OF THE FIGURE

The FIGURE is a block diagram of a remote-controlled receiver arrangement according to the invention.

DESCRIPTION OF THE PREFERRED EMBODIMENT

The block diagram of the FIGURE shows a remote-controlled receiver arrangement, for example, circuit interruptors 11, 12, 13 using a carrier having the frequency $F_1$ which is amplitude-modulated in frequency or in phase with the frequency $F_2$. This carrier contains remote control data, while the receiver arrangement comprises a receiver 21 provided with a local oscillator 22 which receives the said carrier via a matching circuit 60. A demodulator 23 for modulation at the frequency $F_2$ supplies the remote control commands in the form of digital data at its output. As is shown in the FIGURE, the receiver arrangement also comprises a microprocessor 31, for managing the remote control commands from digital data supplied by the demodulator 23 in addition to means for tuning and locking the frequency of the local oscillator 22 on the carrier frequency $F_1$. In the FIGURE these tuning and locking means are constituted by a frequency synthesizer 32, in co-operation with a frequency-incrementing arrangement incorporated in the microprocessor 31 and controlled by means for tuning through the frequency band, in this case push-buttons 33, 34 with which the frequency can be moved up or down.

The microprocessor 31 is connected to a non-volatile memory 51 in which the value of the carrier frequency $F_1$ and the values of the access signal are written, permitting of independent functioning of the receiver arrangement according to the invention in the case of default of the carrier transmitter. In the case of poor operation the frequency written in the non-volatile memory 51 is applied to the frequency synthesizer 32 which tunes the local oscillator 22 to the carrier frequency $F_1$ thus ensuring continuous functioning of the arrangement. The non-volatile memory 51 preserves the initial values of the access signals such as they have been pre-adjusted upon installation of the receiver arrangement, thus providing the possibility of returning to these initial values after they have been modified once or several times. The non-volatile memory 51 thus permanently preserves the last control commands, that is to say, for example, "open" or "closed" state of the circuit interruptors 11, 12, 13. After a current cut-off or any other incident this safety measure permits of returning to the initial position of the circuit interruptors.

In a special embodiment of the invention, the means 33, 34 for tuning through the frequency band form part of a portable control box 40 of the plug-in or cable-connection type, of the infrared or ultrasonic coupling type. This economic arrangement provides the possibility of connecting several remote-controlled receiver arrangements according to the invention with one and the same control box. As is shown in the FIGURE the control box 40 also comprises a display 35, for example, with liquid crystals indicating the value of the tuning frequency. A field level indicator 36 permits of checking the strength of the received carrier. In the embodiment shown in the FIGURE this indicator 36 consists of three light-emitting diodes 61, 62, 63 corresponding to the three given levels of strength.

To put the remote-controlled receiver arrangement according to the invention into operation, it is sufficient to cause the known value of the frequency $F_1$ to appear on the display 35 by operating the means 33, 34 for moving through the frequency band and by checking with the aid of the field level indicator 36 whether the strength of the received carrier is sufficient. As the FIGURE shows there are also test means 37 ensuring a satisfactoy transmission by means of the interface 65 of the remote control commands to the circuit interruptors 11, 12, 13.

The control box 40 comprises a push-button keyboard rendering it possible for the user to compose the identification code numbers and commands to be received and to evaluate them.

What is claimed is:

1. A remote controlled radio frequency receiver for receiving and demodulating control data contained on a carrier signal having a frequency of $F_1$ comprising:
   a local oscillator tunable over a frequency spectrum which contains the frequency $F_1$ for producing a signal $F_2$ modulated on said carrier $F_1$;
   a demodulator circuit for demodulating remote control commands from said signal $F_2$;
   a microprocessor for supplying remote control commands to remotely controlled equipment from digital data supplied by said demodulator;
   means for tuning and locking the frequency of the local oscillator with respect to the carrier frequency $F_1$ comprising a frequency synthesizer having a frequency incrementing means coupled to said microprocessor for tuning the receiver through a frequency band containing carrier frequency $F_1$ in response to tuning commands provided by said microprocessor;
   a portable box control coupled to said microprocessor for manually incrementing said tuning frequency of said oscillator to a preset frequency; and
   a non-volatile memory for preserving initial values of control values, and for storing more recent control commands which have been received, and for storing the carrier frequency $F_1$ of said carrier identifying a tuning frequency for said oscillator which produces said signal $F_2$;
   whereby when said carrier signal level decreases below a level which permits said locking of the local oscillator frequency, said local oscillator is tuned to a correct tuning frequency, and said most recent commands are available to control remote equipment operation when said carrier signal is unavailable, and said initial values are available for controlling said remotely controlled equipment in the event of a failure of said receiver.

2. A receiver arrangement as claimed in claim 1, wherein the control box comprises a display indicating the value of the tuning frequency.

3. A receiver arrangement as claimed in claim 1 wherein the control box includes a field level indicator for checking the strength of the carrier.

4. A receiver arrangement as claimed in claim 1 wherein the control box comprises test means managed by the microprocessor ensuring a satisfactory functioning of the receiver arrangement.

5. A receiver arrangement as claimed in claim 1 wherein the control box is a plug-in type.

6. A receiver arrangement as claimed in claim 1 wherein the control box is of the cableconnection type.

7. A receiver arrangement as claimed in claim 1 wherein the control box is of the infrared coupling type.

8. A receiver arrangement as claimed in claim 1 wherein the control box is of the ultrasonic coupling type.

9. A receiver arrangement as claimed in claim 1 wherein the control box has a push-button keyboard rendering for composing identification code numbers and commands to be received and evaluated.

* * * * *